United States Patent [19]
Bird et al.

[11] Patent Number: 5,608,205
[45] Date of Patent: Mar. 4, 1997

[54] IMAGING DEVICE HAVING REDUCED VERTICAL CROSSTALK

[75] Inventors: Neil C. Bird, Horley; Gerard F. Harkin, London, both of England

[73] Assignee: U.S. Philips Corporation, New York, N.Y.

[21] Appl. No.: 398,324

[22] Filed: Mar. 3, 1995

[30] Foreign Application Priority Data

Mar. 3, 1994 [GB] United Kingdom ............. 9404115

[51] Int. Cl.$^6$ ............................. H04N 1/028; H01L 27/14
[52] U.S. Cl. ........................ 250/208.1; 348/311; 358/482
[58] Field of Search .................... 250/208.1, 208.2; 358/482, 483; 348/294, 311

[56] References Cited

U.S. PATENT DOCUMENTS

| | | | |
|---|---|---|---|
| 4,541,015 | 9/1985 | Itoh et al. | 358/212 |
| 4,565,928 | 1/1986 | Yamamoto et al. | 250/578.1 |
| 4,948,966 | 8/1990 | Arques et al. | 250/208.1 |
| 5,315,101 | 5/1994 | Hughes et al. | 250/208.1 |
| 5,376,782 | 12/1994 | Ikeda et al. | 250/208.1 |
| 5,410,349 | 4/1995 | Tanigawa et al. | 348/311 |
| 5,426,292 | 6/1995 | Bird et al. | 250/208.1 |

FOREIGN PATENT DOCUMENTS

| | | |
|---|---|---|
| 0233489 | 8/1987 | European Pat. Off. . |
| 0324677 | 7/1989 | European Pat. Off. . |
| 2605166 | 4/1988 | France . |

Primary Examiner—Stephone Allen
Attorney, Agent, or Firm—Steven R. Biren

[57] ABSTRACT

Each imaging element (2a) of an array (2) includes a photosensitive element (3) for sensing light incident on the imaging element (2a) and for storing charge representing the incident light and a rectifying element (D1). The imaging elements (2a) are arranged in rows and columns with each photosensitive element (3) and the associated rectifying element (D1) being coupled in series between an associated first conductor (4) and an associated second conductor (5, 6) for allowing charge stored at a selected imaging element (2a) to be read out by applying voltages to the second conductors (5, 6) to forward bias the rectifying element (D1) of the selected imaging element to cause a current representing the charge stored at the photosensitive element (3) of the selected imaging (2a) element to flow through the associated first conductor (4). Each rectifying element (D1) is formed by a photosensitive element for also receiving light incident on the imaging element and the relative dimensions of each photosensitive element (3) and the associated rectifying element (D1) are such that when an imaging element (2a) is receiving light but is not selected any leakage current flows internally within the imaging element (2a) and makes no significant contribution to any current flowing through the associated first conductor, thereby reducing the possibility of vertical cross-talk. (FIG. 2).

6 Claims, 10 Drawing Sheets

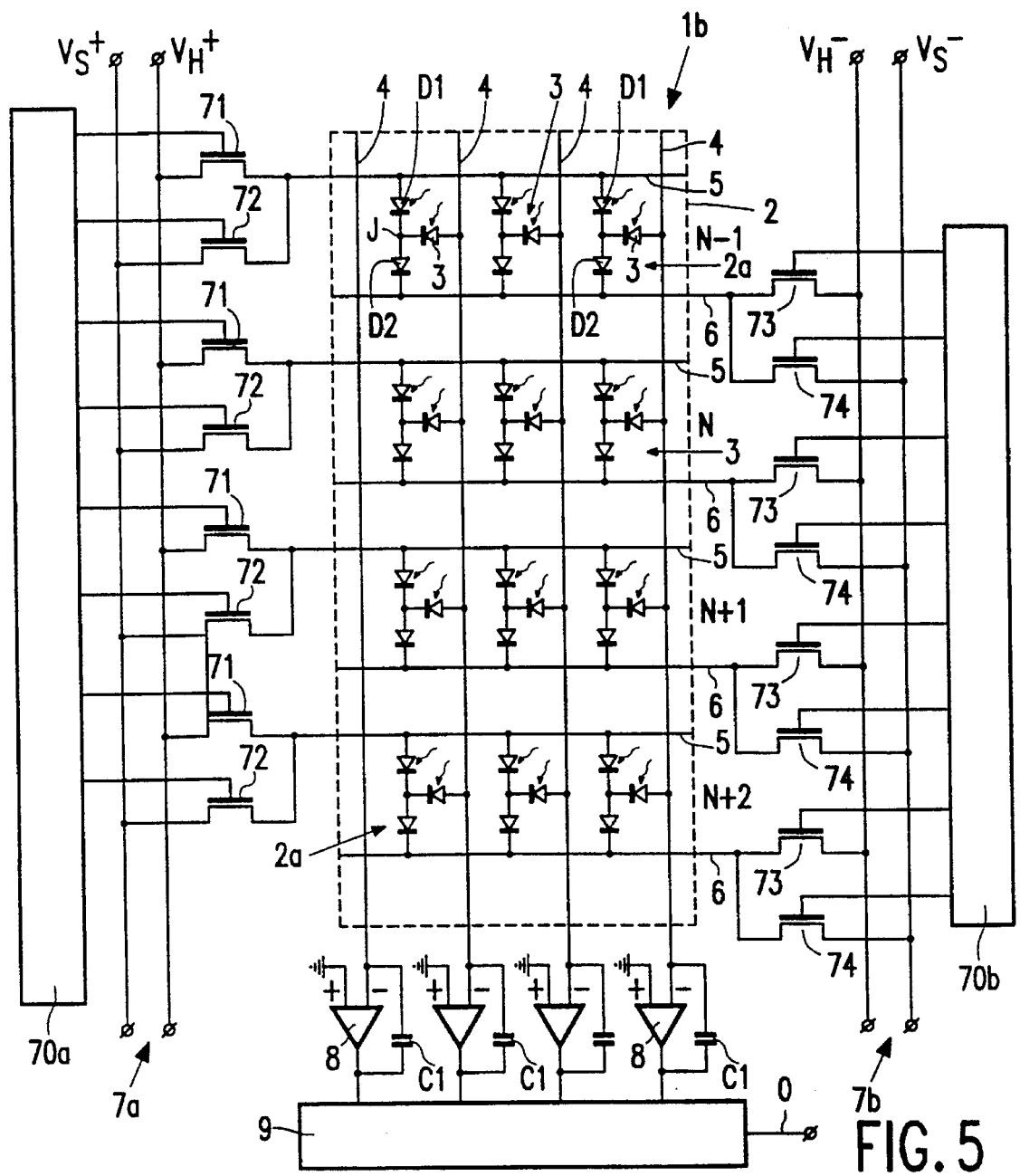
FIG. 5
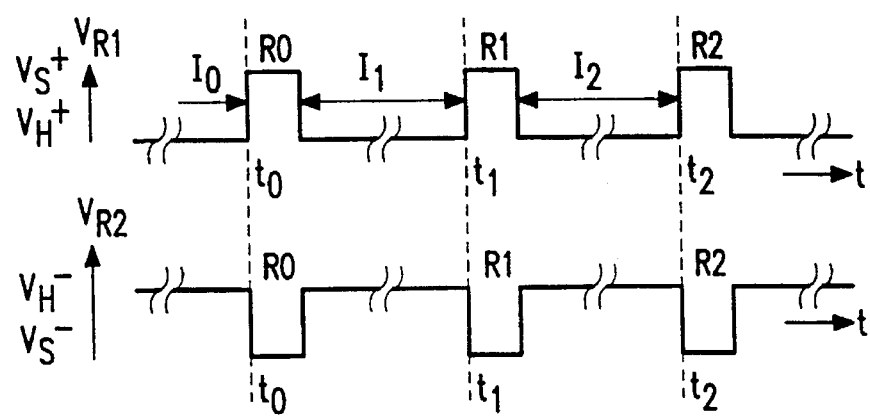
FIG. 6a
FIG. 6b

1

IMAGING DEVICE HAVING REDUCED VERTICAL CROSSTALK

RELATED APPLICATIONS

The present invention is related in subject matter to the following applications by the same inventor and filed simultaneously with this application:
1. Application entitled "A Charge Storage Device", U.S. Ser. No. 08/398,318; and
2. Application entitled "A Charge Storage Device", U.S. Ser. No. 08/398,320.

BACKGROUND OF THE INVENTION

1. Field of the Invention

This invention relates to an imaging device comprising an army of imaging elements each comprising a photosensitive element for sensing light incident on the imaging element and for storing charge representing the incident light and a rectifying element, the imaging elements being arranged in rows and columns with each photosensitive element and the associated rectifying element being coupled in series between an associated first conductor and an associated second conductor for allowing charge stored at a selected imaging element to be read out by applying voltages to the second conductors to forward bias the rectifying element of the selected imaging element to cause a current representing the charge stored at the photosensitive element of the selected imaging element to flow through the associated first conductor.

2. Description of the Related Art

Such an imaging device is described in, for example, U.S. Pat. No. 4948966. FIG. 1 of the accompanying drawings shows an example of an imaging element or pixel 101 of known imaging device 100. Generally, the image sensor 100 will comprise a two-dimensional matrix of N rows and M columns of pixels with associated row 102 and column 103 conductors. However, in the interests of convenience, only one pixel is illustrated in FIG. 1.

The pixel 101 comprises a photosensitive diode PD and a switching diode SD coupled in series between the associated row conductor 102 and associated column conductor 103. In the example shown, the switching diode SD and photosensitive diode PD are arranged with the cathodes coupled together. A capacitor C is shown coupled across the photosensitive diode PD. The capacitor C may be the parasitic capacitance of the photosensitive diode PD or may be an additional capacitor added to increase the dynamic range of the image sensor 100.

Each column conductor 103 is coupled to a suitable charge sensitive amplifier 104 having a capacitive coupling between its negative input and its output.

In operation of such an imaging device light falling on the photosensitive diode PD of the pixel 101 during an integration period causes the capacitance C of the photosensitive diode PD to be discharged. When an appropriate voltage $V_R$ is applied to the associated row conductor 102 to forward bias the switching diode SD, a current starts to flow to recharge the photosensitive diode PD capacitance C enabling the charge stored at the photosensitive diode PD to be integrated by the charge sensitive amplifier 104, so allowing the light sensed by the photosensitive diode PD to be detected.

While the charge stored at a related pixel during a previous integration period is being read by causing the associated switching diode SD to become forward biased, the remaining unselected pixels in the same column still have their switching diodes reverse biased, and at least some of them may be sensing light.

In such an imaging device, vertical cross-talk may result from unwanted currents from unselected pixels flowing down the column or first conductor.

The result of this vertical cross-talk is that the integrated output from the charge sensitive amplifier 8 for the selected pixel may include contributions from all of the other pixels in that column. The main source of the unwanted column currents is "dynamic leakage" from the unselected pixels in that column. Thus, when a pixel is sensing light, the capacitance C of the photosensitive diode PD is being discharged by the photo-generation of charge carriers within the photosensitive diode PD, which in turn means that the voltage across the switching diode SD is changing. The changing voltage $V_x$ at the midpoint J between the two diodes causes a current:

$$I = C_D \frac{dV_x}{dt} \quad (1)$$

to flow through the capacitance $C_D$ of the switching diode SD of the unselected pixel and hence down the associated column conductor 4, so causing vertical cross-talk. This could have the effect of removing information from an image because, for example, black text on a white background could appear white and so be lost in the background.

SUMMARY OF THE INVENTION

It is an aim of the present invention to at least reduce the likelihood of the occurrence of such vertical cross-talk.

According to the present invention, there is provided an imaging device comprising an array of imaging elements each comprising a photosensitive element for sensing light incident on the imaging element and for storing charge representing the incident light and a rectifying element, the imaging elements being arranged in rows and columns with each photosensitive element and the associated rectifying element being coupled in series between an associated first conductor and an associated second conductor for allowing charge stored at a selected imaging element to be read out by applying voltages to the second conductors to forward bias the rectifying element of the selected imaging element to cause a current representing the charge stored at the photosensitive element of the selected imaging element to flow through the associated first conductor, characterized in that each rectifying element comprises a photosensitive element for also receiving light incident on the imaging element and in that the relative dimensions of each photosensitive element and the associated rectifying element are such that when an imaging element is receiving light but is not selected any leakage current flows internally within the imaging element and makes no significant contribution to any current flowing through the associated first conductor.

It should be understood that, as used herein, the term "rectifying element" means any element which has an asymmetric characteristic and passes as low a current as possible in one direction (the reverse direction) and the required current in the other direction (the forward direction).

Thus, in a device in accordance with the invention, by making the rectifying element photosensitive and appropriately selecting the relative dimensions of each photosensitive element and its associated rectifying element, the possibility of vertical cross-talk can be eliminated or at least much reduced so avoiding or at least reducing the possibility of information in the sensed image being lost due to such cross-talk.

The photosensitive elements may comprise photosensitive diodes, for example p-i-n photosensitive diodes formed by thin film technology.

The rectifying elements may comprise diodes which may be formed by thin film technology.

In one example, the photosensitive and rectifying elements comprise junction diodes and the relative dimension of each photosensitive element and the associated rectifying element are such that for each imaging element:

$$C_D I_P = C_P I_D$$

where $C_D$ and $C_P$ are the intrinsic capacitances of the photosensitive rectifying element and the photosensitive element, respectively, and $I_P$ and $I_D$ are the currents generated by light incident on the photosensitive element and the photosensitive rectifying element, thereby reducing leakage current from a photosensitive element during the reading out of charge from another photosensitive element in the same column of photosensitive elements.

In such an example, for each imaging element, the rectifying element may have a given area and the photosensitive element and the photosensitive rectifying element a second given area which is exposed to incident light with the respective areas of the rectifying and photosensitive elements being such that:

$$\left(\frac{A_{CD1}}{A_{DD1}}\right) = \left(\frac{A_{C3}}{A_{D3}}\right)$$

where $A_{D3}$ and $A_{DD1}$ are the areas of a photosensitive element and the associated rectifying element, respectively, while $A_{C3}$ and $A_{CD1}$ are the second given areas of a photosensitive element and the associated photosensitive rectifying element, respectively, which are exposed to incident light.

In one embodiment each imaging element is associated with a third conductor with each photosensitive rectifying element being coupled in series with a further rectifying element between the associated second and third conductors and with the photosensitive element of the imaging element being coupled between the associated first conductor and a junction between the associated photosensitive and further rectifying elements.

In such an embodiment, each pixel or imaging element is read out by applying voltages to the second and third conductors that will forward-bias both of the rectifying elements so that a current flows through the two rectifying elements defining a voltage at the junction which, if rectifying elements are of the same size, will be equal to the average of the voltages applied to the second and third conductors. In an imaging device, this reduces the possibility of incomplete charging of a photosensitive element and so reduces the possibility of so-called lag which could otherwise result in bluffing if moving images are being sensed.

In a first example of such an embodiment, the third conductor of each row of imaging elements also forms the second conductor of any adjacent rows of imaging elements and the rectifying elements of alternate rows of imaging elements are oppositely oriented to the rectifying elements of the remaining rows of imaging elements so that when forward-biassed the rectifying elements of the said alternate rows of imaging elements allow current to flow in one direction between the second and third conductors while when forward-biassed the rectifying elements in the remaining rows of imaging elements allow current to flow in the opposite direction between the second and third conductors and means are provided for applying voltages to the second and third conductors for enabling only the rectifying elements of a selected row of imaging elements to be forward-biassed to allow charge stored at the photosensitive elements of the selected row to be read.

The means for applying voltages to the second and third conductors for enabling only the rectifying elements of a selected row of imaging elements to be forward-biassed to allow charge stored at the photosensitive elements of the selected row to be read may comprise a first voltage supplying means for supplying voltages to the second conductors and a second voltage supplying means for supplying voltages to the third conductors.

In second example of such an embodiment, each row of imaging elements shares its second and third conductors with any adjacent rows with one of the two conductors associated with each row forming a row conductor and the other being provided by one of reference conductors so that adjacent row conductors are separated by a reference conductor and each first reference conductor is separated from any other first reference conductor by two row conductors and a second reference conductor, the rectifying elements of imaging elements associated with a respective row conductor being oppositely oriented to the first and second rectifying elements of imaging elements associated with any adjacent row conductors and means are provided for applying different reference voltages to the first and second reference conductors respectively and for applying voltages to the row conductors for enabling only the first and second rectifying elements of a selected row of imaging elements to be forward-biassed to allow charge stored at the photosensitive elements of the selected row to be read.

The first and second examples allow the possibility of lag and thus of blurring of moving images to be reduced without having to increase the number of conductors required. This should allow the imaging device to be more transparent where that is desirable, for example where the image sensor is to be mounted over a display. As an alternative, this should allow the photosensitive elements to be larger which may be especially desirable for X-ray diagnostics applications where light levels may be low and a high sensitivity consequently required.

Providing the further rectifying element in each pixel should enable the imaging device to operate in low-light conditions without exercise lag time and it should also be possible to read the pixels more quickly because it should be possible to recharge the pixel capacitances more quickly.

In such examples where a further rectifying element is provided in each imaging element or pixel, the photosensitive rectifying elements and photosensitive elements are arranged so that, for each imaging element $$(C_x + C_y) I_P = C_P I_D$$

where $C_x$, $C_y$ and $C_p$ are the intrinsic capacitances of the photosensitive rectifying element, the further rectifying element and the photosensitive element, respectively, and $I_P$ and $I_D$ are the currents generated by light incident on the photosensitive element and the photosensitive rectifying element, thereby reducing leakage current from a storage element during the reading out of charge from another storage element in the same column of storage elements.

In such an example, for each imaging element, the associated rectifying elements may have a given area and the photosensitive element and the photosensitive rectifying element may have a second given area which is exposed to incident light with the respective areas of the rectifying and photosensitive elements being such that:

$$\left(\frac{A_{CD1}}{2A_{DD1}}\right) = \left(\frac{A_{C3}}{A_{D3}}\right)$$

where $A_{D3}$ and $A_{DD1}$ are the areas of a photosensitive element and the associated rectifying elements, respectively, while $A_{C3}$ and $A_{CD1}$ are the second given areas of a photosensitive element and the associated photosensitive rectifying element, respectively, which are exposed to incident light.

BRIEF DESCRIPTION OF THE DRAWING

Embodiments of the present invention will now be described, by way of example, with reference to the accompanying drawing, in which:

FIG. 5 is a schematic circuit layout for a second example of an imaging device in accordance with the invention;

FIGS. 6a and 6b illustrate voltages applied during the operation of the imaging device shown in FIG. 5;

It should of course be understood that the drawings are not to scale and that like reference numerals are used throughout text to refer to like parts.

DETAILED DESCRIPTION OF THE PREFERRED EMBODIMENTS

Figure 1:
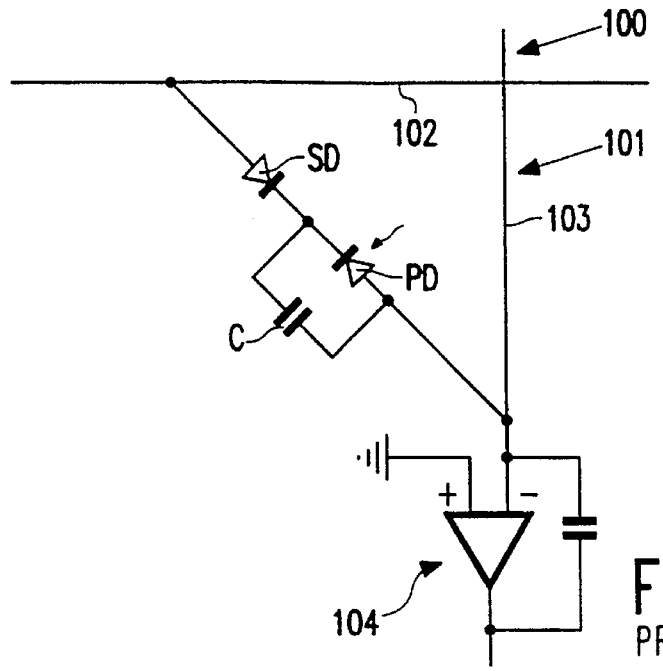
FIG. 1 is a very simple circuit diagram of one pixel of a known imaging device.

Referring now to the drawings, there is illustrated an imaging device 1a, 1b, 1c, 1d comprising an array 2 of imaging elements 2a each comprising a photosensitive element 3 for sensing light incident on the imaging element 2a and for storing charge representing the incident light and a rectifying element D1, the imaging elements 2a being arranged in rows and columns with each photosensitive element 3 and the associated rectifying element D1 being coupled in series between an associated first conductor 4 and an associated second conductor 5, 6 for allowing charge stored at a selected imaging element 2a to be read out by applying voltages to the second conductors 5, 6 to forward bias the rectifying element D1 of the selected imaging element to cause a current representing the charge stored at the photosensitive element 3 of the selected imaging 2a element to flow through the associated first conductor 4.

In accordance with the invention, each rectifying element D1 comprises a photosensitive element for also receiving light incident on the imaging element and the relative dimensions of each photosensitive element 3 and the associated rectifying element D1 are such that when an imaging element 2a is receiving light but is not selected any leakage current flows internally within the imaging element 2a and makes no significant contribution to any current flowing through the associated first conductor.

Thus, in a device in accordance with the invention, by making the rectifying element D1 photosensitive and appropriately selecting the relative dimensions of each photosensitive element 3 and its associated rectifying element D1, the possibility of vertical cross-talk can be eliminated or at least much reduced so avoiding or at least reducing the possibility of information in the sensed image being lost due to such cross-talk.

Figure 2:
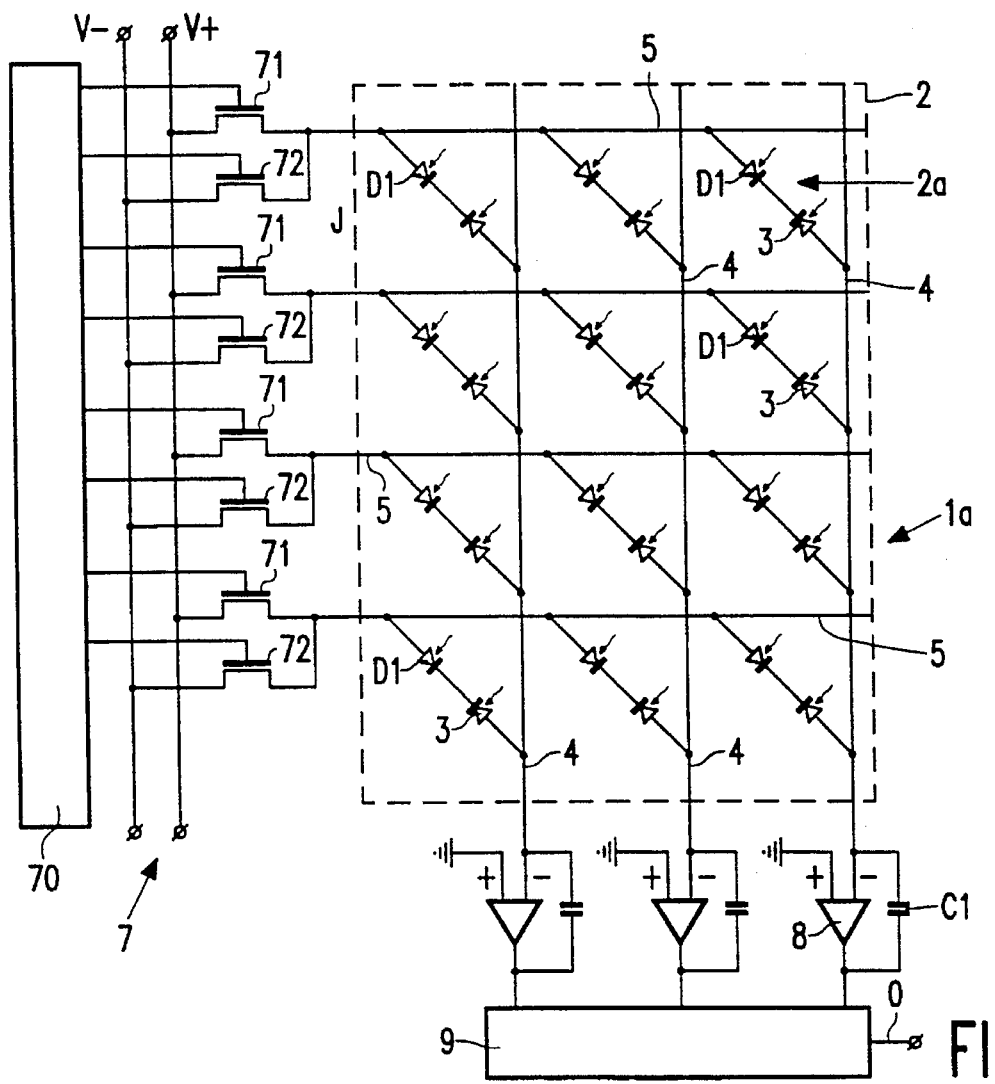
FIG. 2 is a schematic circuit layout for a first example of an imaging device in accordance with the invention.

FIG. 2 is a schematic layout diagram of one example 1a of an imaging device in accordance with the invention. In this example, the imaging device 1a is an image sensor.

The image sensor 1 comprises an array 2 of pixels 2a arranged in rows and columns. The border of the array 2 is illustrated by a dashed line in FIG. 2. Although only an array of three columns and four rows of pixels 2a is shown in FIG. 2, it will be appreciated by those skilled in the art that the array may generally comprise a much larger number of rows and columns of pixels 2a.

Each pixel 2a comprises a photosensitive diode 3 coupled in series with a switching diode D1 between an associated first or column conductor 4 and second conductor 5.

As shown in FIG. 2, the photosensitive and switching diodes 3 and D1 are oriented so that the anodes of the switching diodes D1 are coupled to the associated second or row conductor 5 while the anodes of the photosensitive diodes 3 are coupled to the associated first or column conductor 4.

In the example illustrated in FIG. 2a a driving circuit arrangement 7 is provided for supplying the appropriate voltages to the row or second conductors 5.

Each of the row conductors 5 is coupled to voltage supply lines V+ and V− via respective switching transistors 71 and 72. The gate or control electrodes of the switching transistors 71 and 72 are coupled to a shift register and decoder circuit 70. The shift register and decoder circuit 70 is arranged to activate the appropriate transistors 71 and 72 under the control of clock signals in known manner to allow the appropriate voltage signals to be applied to the row conductors 5 at the appropriate times.

The column conductors 4 are each coupled via a respective charge sensitive amplifier 8 of known form to an output shift register and decoder circuit 9 from which image signals may be supplied by an output O to an appropriate store or to a display, neither of which is shown.

Each charge sensitive amplifier 8 has its output coupled to its negative input via a capacitor C1 and serves to convert a current supplied through the associated column conductor 4 during readout of stored charge into a voltage output. The positive inputs of the charge sensitive amplifiers 8 are coupled to ground or any suitable fixed reference potential. The fixed reference potential is effectively determined by the row voltages because the photosensitive diodes 3 must always be reverse-biased.

In operation of the imaging device 1a shown in FIG. 2, when the voltages applied to the second or row conductors 5 are such that the associated switching diodes D1 are reverse-biased, the photosensitive diodes 3 store charge representing the light incident on the imaging elements 2a in the manner described above with reference to FIG. 1. Thus, light falling on an imaging element 2a causes the capacitance of the photodiode to be discharged. When an appropriate voltage is applied to a selected row conductor to forward bias the associated switching diodes D1, current starts to flow to recharge the capacitance of the photosensitive diodes 3 of that row and so effectively, the charge stored at each photosensitive diode 3 of the selected row is integrated by the charge sensitive amplifier 8 associated with the particular column.

Figure 3:
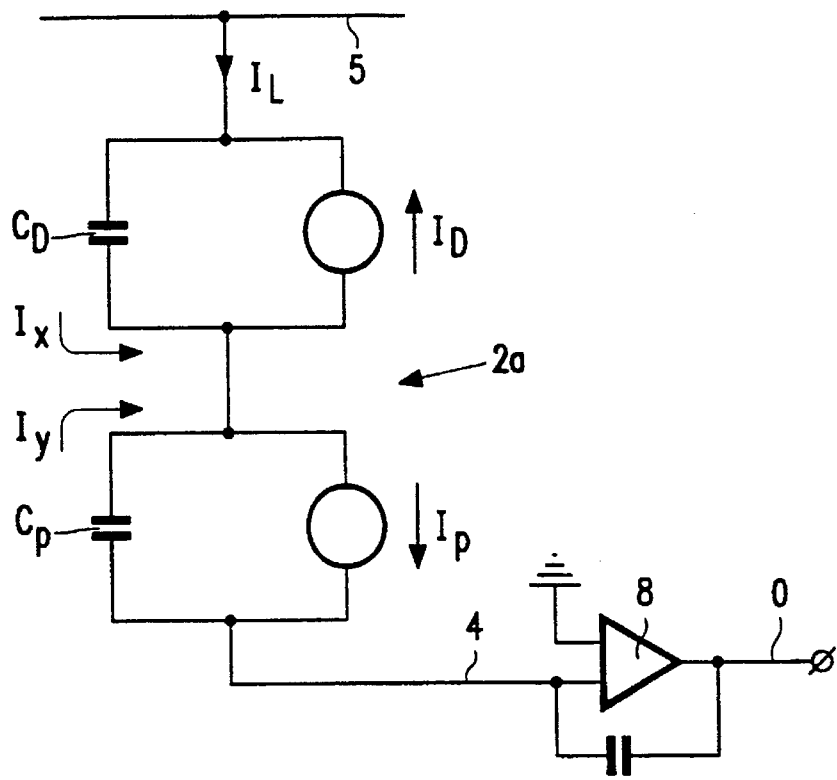
FIG. 3 illustrates an equivalent circuit diagram for a pixel or imaging element of the imaging device shown in FIG. 2.

In contrast to the known imaging device described above with reference to FIG. 1, however, the illuminated unselected pixels 2a of the same column of pixels 2a do not contribute significantly, if at all, to the current flowing through the column conductor 4. The reasons for this will be explained with the help of FIG. 3 which is an equivalent circuit diagram for a pixel 2a. In FIG. 3, the photosensitive switching diode D1 is represented as a source of current $I_P$ in parallel with the capacitance $C_D$ while the photosensitive diode 3 is represented as a source of current $1_P$ in parallel with a capacitance $C_P$.

Consider the situation where the pixel 2a is unselected and is sensing light while another selected pixel is being read out. From FIG. 3 and using Kirchhoff's Law, then the leakage current $I_L$ flowing down the column conductor 4 from the unselected pixel 2a is:

$$I_P - I_L = I_Y \quad (2)$$

where $I_Y$ is the current flowing through the capacitance $C_P$, and $$I_L + I_D = I_X \quad (3)$$

where $I_X$ is the current flowing through the capacitance $C_D$ also $$I_X = -C_D \frac{dV_X}{dt}, I_Y = -C_P \frac{dV_X}{dt} \quad (4)$$

From equations 2, 3 and 4 an expression can be obtained for $I_L$, as follows $$I_L = \frac{C_D I_P - C_P I_D}{C_P + C_D} \quad (5)$$

From equation 5, the condition for zero leakage current $I_L$ is:

$$C_D I_P = C_P I_D \quad (6)$$

Thus if:

$$\frac{I_P}{C_P} = \frac{I_D}{C_D} \quad (7)$$

then $I_L$ equals zero and the vertical crosstalk is eliminated.

The photosensitive current $I_{PHOTO}$ is equal to $KA_C$ where K is a constant and $A_C$ is the area of the photosensitive diode which is exposed to light (normally this area is the area of the hole in the opaque electrode or contact of the photosensitive diode). Accordingly the condition for no leakage current can be defined by the geometry of the photosensitive diodes D1 and 3. If it is assumed that the thickness of all the diodes D1 and 3 of a pixel is the same, then, in terms of this geometry, equation 7 becomes:

$$\left( \frac{A_{CD1}}{A_{DD1}} \right) = \left( \frac{A_{C3}}{A_{D3}} \right) \quad (8)$$

where $A_{DD1}$ and $A_{D3}$ are the areas of the switching diode D1 and photosensitive diode 3, respectively, and are thus proportional to their respective capacitances while $A_{CD1}$ and $A_{C3}$ are the areas of the switching diode D1 and photosensitive diode 3, respectively, exposed to incident light and are so proportional to the photocurrent generated by light incident on the respective diode. As used herein the term "area" in relation to the diodes D1 and 3 means the area of the diode in a plane generally parallel to the diode electrodes.

Accordingly, by appropriately selecting the relative geometries of the diodes D1 and 3, the leakage current from an unselected pixel in the column of the selected pixel will flow internally within the capacitance/photocurrent loop of that unselected pixel and not through the column conductor 4, so eliminating or at least substantially reducing the vertical cross-talk. Thus, for example, if the areas of the contact holes (that is the areas exposed to light) of the two photosensitive diodes $A_{CD1}$ and $A_{C3}$ are equal, then, for zero vertical cross-talk, the area $A_{D3}$ of the photodiode 3 should be the same as that $A_{DD1}$ of the photosensitive switching diode D1. Of course, other relative geometies and dimensions may be possible which meet the conditions of equation 8.

Of course, with appropriate reversal of voltages polarities, the photosensitive and switching diodes 3 and D1 may be reversed so as to have their anodes rather than their cathodes connected.

Figure 4:
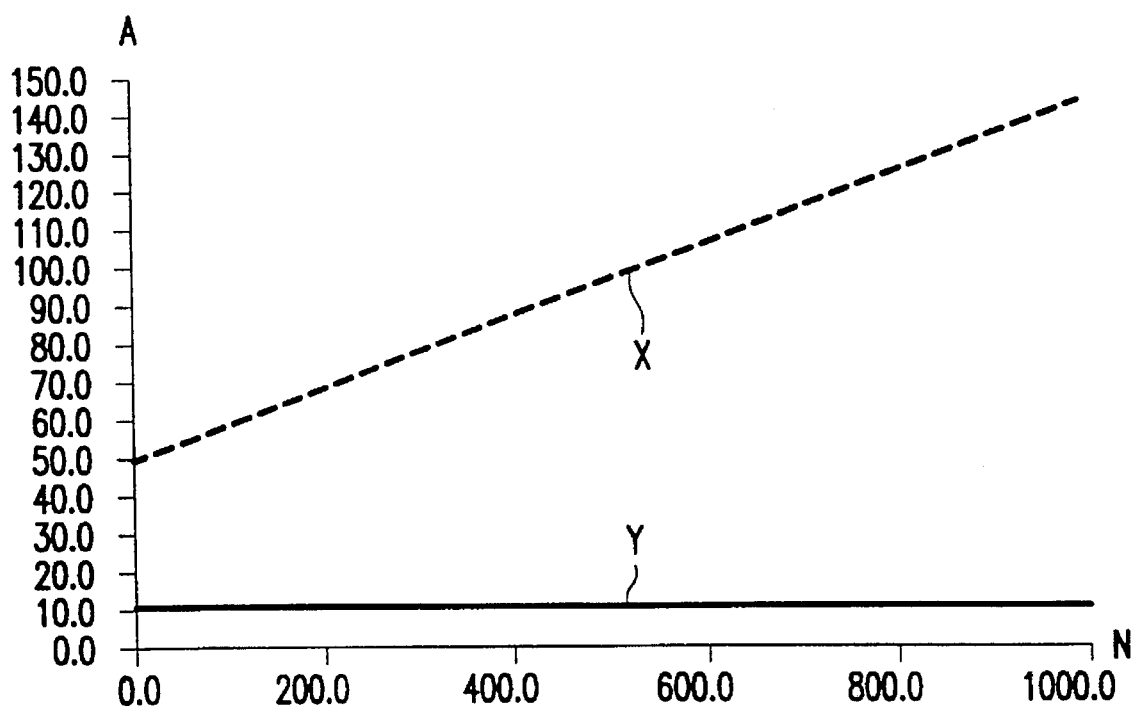
FIG. 4 illustrates graphically a comparison between the imaging device of FIG. 1 and an imaging device in accordance with the performance of the invention.

FIG. 4 illustrates graphically the effect of making the switching diodes D1 photosensitive. Thus, in FIG. 4 the vertical axis represents in arbitrary units the output A of the associated charge sensitive amplifier 8 when the selected pixel 2a is a dark pixel, that is the pixel has not been exposed to light since the previous reading out of that pixel 2a, while the horizontal axis represents the number N of unselected 'bright' pixels in the same column as the selected pixel, where the term 'bright pixel' means a pixel which is sensing light.

The dotted line X in FIG. 4 illustrates the output of the associated charge sensitive amplifier 8a when the switching diodes D1 of the column are not sensitive to light while the solid line Y in FIG. 4 shows the output of the charge sensitive amplifier 8 when the switching diodes D1 of the column are photosensitive in accordance with the invention.

As can clearly be seen from FIG. 4, in the case where the switching diodes D1 are not photosensitive, the output of the charge sensitive amplifier 8 increases linearly with the number of illuminated pixels in the same column showing that leakage currents from unselected pixels in the same column are making a significant contribution to the current detected by the charge sensitive amplifier 8. In startling contrast as the solid line Y shows, the charge detected by the charge sensitive amplifier 8 of an imaging device in accordance with the invention does not change with the number of bright pixels 2a in the same column 8a showing that leakage current from those bright or illuminated pixels do not make any (or at least do not make any significant) contribution to the signal detected by the charge sensitive amplifier 8. Thus, the selected pixel 2a is correctly identified as being dark and is not swamped or obliterated by leakage currents from unselected pixels in the same column.

Although the imaging device 1a shown in FIG. 2 avoids or at least reduces the problems of vertical cross-talk, there is a possibility that, due to incomplete charging of the capacitances of the photosensitive diodes 3, there may be some "lag" in the image sensed. This should not present a problem where a stationary or slow moving image is being sensed but it could result in some blurring of the image if parts of the image are moving or changing rapidly.

Such lag arises if the photosensitive diode 3 capacitance of a pixel has not been completely recharged at the end of a readout pulse or period because, in such a case, even when no light falls on that pixel in the period between the end of that readout period and the next readout period, the rectifying diode D1 will again be forward-biased during that next readout period because charging of the photosensitive diode capacitance C was not completed during the previous readout pulse. A small amount of current thus flows and the photosensitive diode capacitance C is charged a little more. This process repeats for the next few readout pulses with, each time, the amount of charging becoming a little smaller. Such lag, if it occurs, has the effect of causing the appropriate pixel of the image to look bright even when there is no longer light falling on the corresponding imaging element and so can result in blurring of a moving or changing image.

FIG. 5 illustrates an example of an imaging device 1b in accordance with the invention which additionally is designed to avoid or at least reduce such lag problems.

As shown in FIG. 5, each pixel or imaging element 2a incorporates a further rectifying element D2. Each rectifying element D2 is formed to be similar, generally identical, to the associated rectifying element D1 except that the rectifying elements D2 are not photosensitive.

The two rectifying elements D1 and D2 of each pixel 2a are coupled in series between second and third conductors 5 and 6 and the photosensitive diode 3 is coupled between the associated first conductor 4 and a junction J between the diodes D1 and D2.

As shown, each diode D1 has its anode coupled to the associated second conductor 5 while each diode D2 has its cathode coupled to the associated third conductor 6. The photosensitive diodes 3 have their anodes coupled to the associated first or column conductor 4. Of course, with appropriate changes in the polarities of the voltages applied during operation of the imaging device 1b (or indeed the imaging device 1a) the orientations of the diodes D1, D2 and 3 could be reversed.

In the example illustrated in FIG. 5 two row driver arrangements 7a and 7b are used. The second conductors 5 are row conductors coupled via transistors 71 and 72 to a first shift register and decoder circuit 70a while the third conductors 6 are row conductors coupled via transistors 73 and 74 to a second shift register and decoder circuit 70b. The use of two such row driver arrangements 7a and 7b enables, as will be seen from the following, known row driving arrangements which are capably of supplying only two or three different voltages to be used.

As in the previous example, a pixel 2a of the imaging device 1b is read out by applying voltages to the row conductors 5 and 6 which will forward bias the associated switching diodes D1 and D2.

FIGS. 6a and 6b illustrate graphically the charge in voltages $V_{R1}$ and $V_{R2}$ on the row conductors 5 and 6 respectively with time and illustrate the application at times $t_0$, $t_1$ and $t_2$ of readout pulses $R_1$, $R_1$ and $R_2$. The periods $I_0$, $I_1$, $I_2$ between readout pulses are the integration periods during which the pixel concerned is storing charge representing any light incident on the pixel.

As illustrated by FIGS. 5 and 6, during an integration period for a particular row of pixels 2a, the shift register and decoder circuits 70a and 70b render the associated transistors 71 and 73 conducting so that voltages $V_H^+$ and $V_H^-$ are supplied to the row conductors 5 and 6 so ensuring that the switching diodes D1 and D2 of that row are reverse-biassed.

In order to read charge stored at pixels in a particular row, the shift register and decoder circuits 70a and 70b render the transistors 72 and 74 conducting so as to apply the voltages $V_S^+$ and $V_S^-$ to the row conductors 5 and 6, respectively, thereby ensuring that the switching diodes D1 and D2 of the selected pixel row are strongly forward biased allowing for rapid recharging of the capacitance of the photosensitive diode 3 of the selected row. Current will flow through the photosensitive diode 3 capacitance of the each selected pixel until the voltage at the associated junction J is reached. If the switching diodes D1 and D2 are identical (except in their ability to sense light) the voltage at the junction J will be the average of the voltages on the associated row conductors 5 and 6. At this stage, the pixel has reached its steady state and the read out is complete. The photosensitive diode 3 capacitance has thus been recharged within one read out period so avoiding the possibility of any lag.

As an alternative to the layout shown in FIG. 5, the conductors 6 may be coupled to a fixed reference potential and appropriate voltages supplied by the row driver arrangement 7a to render the switching diodes D1 and D2 forward or reverse biased as and when required.

Figure 7:
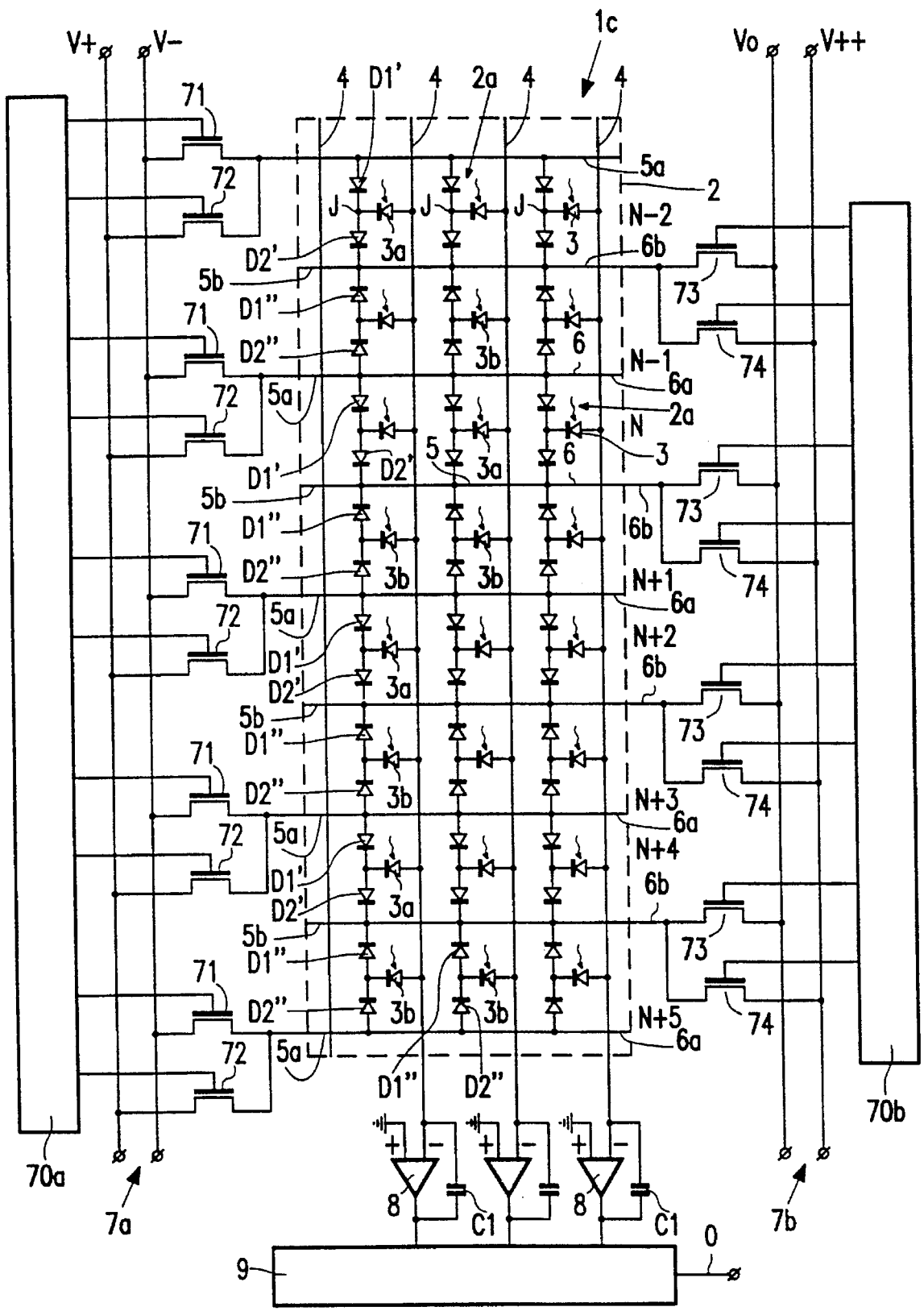
FIG. 7 is a schematic circuit layout for a third example of an imaging device in accordance with the invention.

FIG. 7 illustrates another example of an imaging device 1c in accordance with the invention in which each pixel 2a comprises a further rectifying element D2. Although only an array of three columns and eight rows of pixels 2a is shown in FIG. 7, it will be appreciated by those skilled in the art that the array may generally comprise a much larger number of rows and columns of pixels 2a.

In the example shown in FIG. 7 the third conductor 6a, 6b of each row of imaging elements 2a also forms the second conductor 5a, 5b of any adjacent rows of imaging elements 3, the first and second rectifying elements D1' and D2' of imaging elements 2a in alternate rows N–2, N, N+2, N+4, ... (N+2n, where n is an integer) being oppositely oriented to the first and second rectifying elements D1" and D2" of imaging elements 2a in the remaining rows N–1, +1, N+3, N+5 ... (N+(2n–1), where n is an integer) so that when forward-biased the first and second rectifying elements D1' and D2' of imaging elements 2a in the said alternate rows N, N+2, N+4, ... allow current to flow in one direction between the second and third conductors 5a and 6b while when forward-biased the first and second rectifying elements D1" and D2" of imaging elements in the remaining rows N+1, N+3 ... allow current to flow in the opposite direction between the second and third conductors 5b and 6a.

This enables problems of incomplete recharging of photosensitive elements 3 to be reduced without having to increase the overall number of conductors associated with the rows of imaging elements 2.

In this case, the switching diodes D1' and D2' in alternate rows N–2, N, N+2, N+4 ... (N+2n) are oriented so that the anodes of the first switching diodes D1' are coupled to the associated second conductor 5a while the cathodes of the switching diodes D2' are coupled to the associated third conductor 6b. The switching diodes D1" and D2" associated with the remaining rows N−1, N+1, N+3 . . . (N+(2n−1)) of pixels 2a are oppositely oriented to the switching diodes D1' and D2' so that the cathodes of the switching diodes D1" are coupled to the associated second conductor 5b while the anodes of the second switching diodes D2" are coupled to the associated third conductor 6a.

In each of the pixels 2a, the photosensitive diodes 3 are oriented so that the cathode of each photosensitive diode 3 is coupled to the junction J between the corresponding first and second switching diodes D1 and D2. As is clearly evident from FIG. 7, the third conductor 6b of the Nth row of pixels 2a forms the second conductor 5b of the N+1 row of pixels 2a while the third conductor 6a of the N+1 row of pixels 2a forms the second conductor 5a of the N+2 row of pixels 2a.

Each of the row conductors 5a, 6a is coupled to voltage supply lines V+ and V− via respective switching transistors 71 and 72 of a first row driving circuit 7a. The gate or control electrodes of the switching transistors 71 and 72 are coupled to a shift register and decoder circuit 70a. A second row driving circuit 7b similarly comprises switching transistors 73 and 74 coupling the row conductors 5b, 6b to voltage supply lines Vo and V++, respectively, and having their control or gate electrodes coupled to a shift register and decoder circuit 70b. The shift register and decoder circuits 70a and 70b are again arranged to activate the appropriate transistors 71 to 74 under the control of clock signals in known manner to allow the appropriate voltage signals to be applied to the row conductors 5 and 6 at the appropriate times.

The operation of the image sensor 1c will now be explained.

In order to read out charge previously stored at a pixel in row N, the first or left row driving circuit 70a renders conducting the transistors 71 coupled to the row conductors 5a of the pixel rows N−2, N+2, N+4, . . . and the transistor 72 coupled to the row conductor 5a of the pixel row N. Thus, the row conductor 5a of the pixel row N is coupled to the voltage supply line V+ while the row conductors 5a of the pixel rows N−2, N+2, N+4, . . . (N+2n, where n≠0) are coupled to the voltage supply line V−. At the same time, the second or right row driving circuit 70b renders conducting the transistors 73 coupled to the row conductors 5b of the pixel rows N+1, N+3, N+5, . . . (N+(2n−1), where n≠0) and the transistor 74 coupled to the row conductor 5b of the pixel row N−1. Thus, the row conductor 5b of the pixel row N−1 is coupled to the voltage supply line V++ while the row conductors 5b of the pixel rows N+1, N+3, N+5, . . . are coupled to the voltage supply line Vo. The voltage V++ is more positive than the voltage V+ which is itself more positive than the voltage Vo which is more positive than the voltage V−.

The switching diodes D1' and D2' of the pixels 2a in the pixel row N are thus forward-biased while the switching diodes D1 and D2 of the pixels 2a of the pixel rows except the row N are reverse-biased. Current will flow through the photosensitive diode capacitances C of the pixels of the pixel row N to be integrated by the associated charge sensitive amplifier 8 which supplies an output signal to the output shift register and decoder circuit 9 from which image signals may be supplied by an output O to an appropriate store or to a display, neither of which is shown. Current flows through the photosensitive diode capacitances C of the pixels of the pixel row N until the average of the voltages of the two associated row conductors is reached. Thus, the photosensitive diode capacitance C can be completely recharged within the corresponding readout pulse and there is accordingly no, or at least considerably reduced, lag.

In order to read out charge previously stored at a pixel in row N+1, the first or left row driving circuit 70a renders conducting the transistors 71 coupled to the row conductors 5a of the pixel rows N−2, N, N+4, . . . (N+2n, where n≠1) and the transistor 72 coupled to the row conductor 5a of the pixel row N+2. Thus, the row conductor 5a of the pixel row N+2 is coupled to the voltage supply line V+ while the row conductors 5a of the pixel rows N−2, N, N+4, . . . (N+2n, where n≠1) are coupled to the voltage supply line V−. At the same time, the second or right row driving circuit 70b renders conducting the transistors 73 coupled to the row conductors 5b of the pixel rows N−1, N+1, N+5, . . . (N+(2n−1), where n≠2) and the transistor 74 coupled to the row conductor 5b of the pixel row N+3. Thus, the row conductor 5b of the pixel row N+3 is coupled to the voltage supply line V++ while the row conductors 5b of the pixel rows N−1, N+1, N+5, . . . are coupled to the voltage supply line Vo.

The switching diodes D1 and D2 of the pixels 2a in the pixel row N+1 are thus forward-biased while the switching diodes D1 and D2 of the pixels 2a of the pixel rows except the row N+1 are reverse-biased. Current will flow through the photosensitive diode capacitances C of the pixels of the pixel row N+1 to be integrated by the associated charge sensitive amplifier 8 which supplies an output signal to the output shift register and decoder circuit 9 from which image signals may be supplied by an output O to an appropriate store or to a display, neither of which is shown.

Again, current flows through the photosensitive diode capacitances C of the pixels of the pixel row N+1 until the average of the voltages of the two associated row conductors is reached so that the photosensitive diode capacitance C can be completely recharged within the corresponding readout pulse and there is accordingly no, or at least considerably reduced, lag.

Although the image sensors described above may be of any suitable construction, generally the image sensor 1 is formed using thin film technology on a suitable insulative substrate. Of course, where it is required for light to be capable of passing through the image sensor 1, then the substrate should be transparent to that light.

The row driver arrangements and charge sensitive amplifiers 8 and output shift register and decoder circuit 9 may be formed on separate substrates from (or around the periphery) of the array 2 and may, for example, be in the form of polycrystalline film transistor circuitry.

Figure 8:
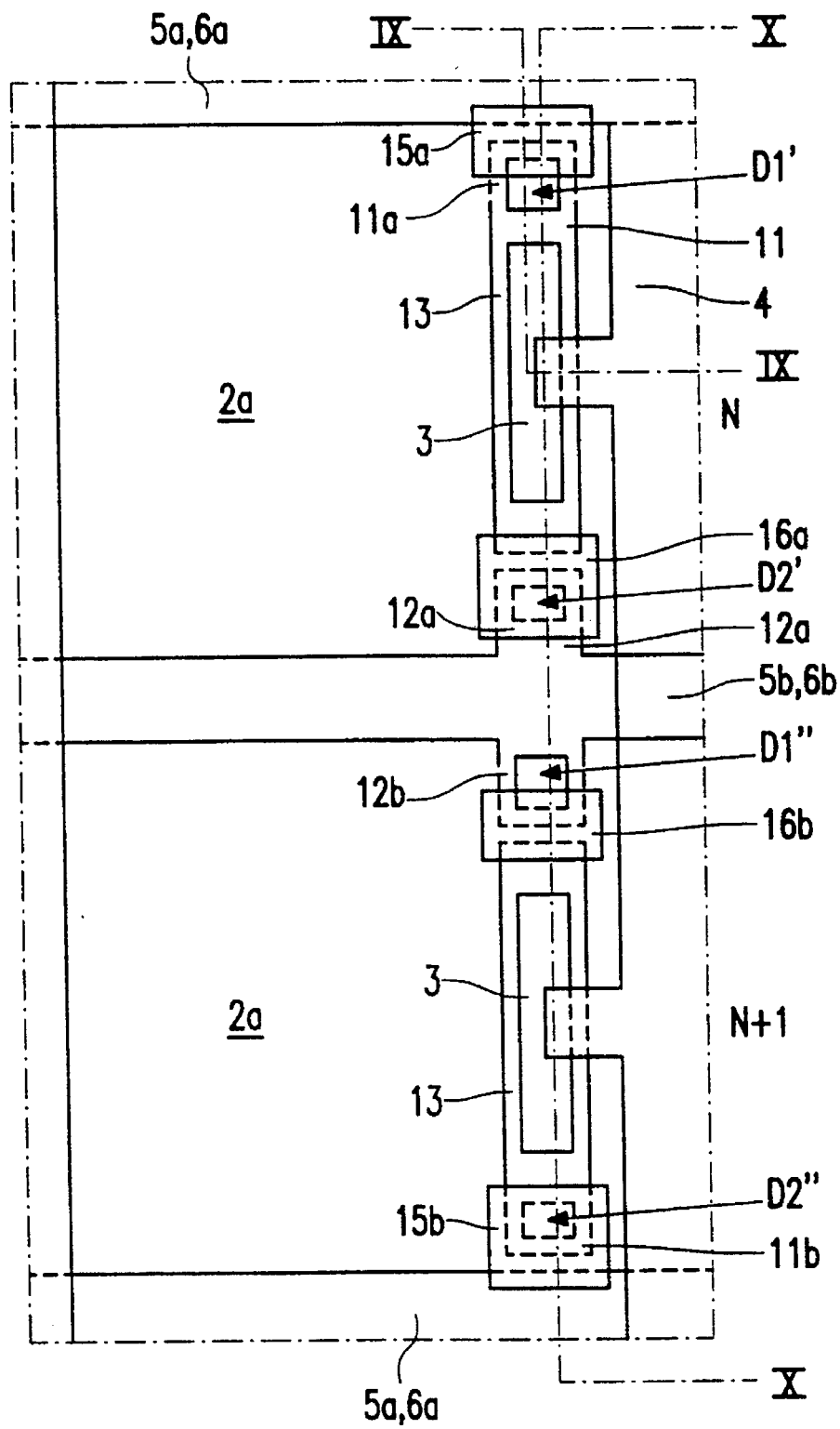
FIG. 8 shows a plan view of part of the imaging device shown in FIG. 7 illustrating one possible layout.
Figure 9:
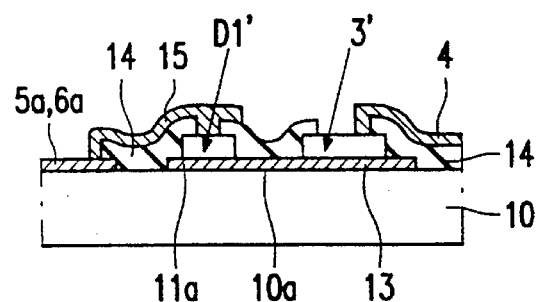
FIGS. 9 and 10 are cross-sectional views taken along the lines IX—IX and X—X, respectively, in FIG. 8.
Figure 10:
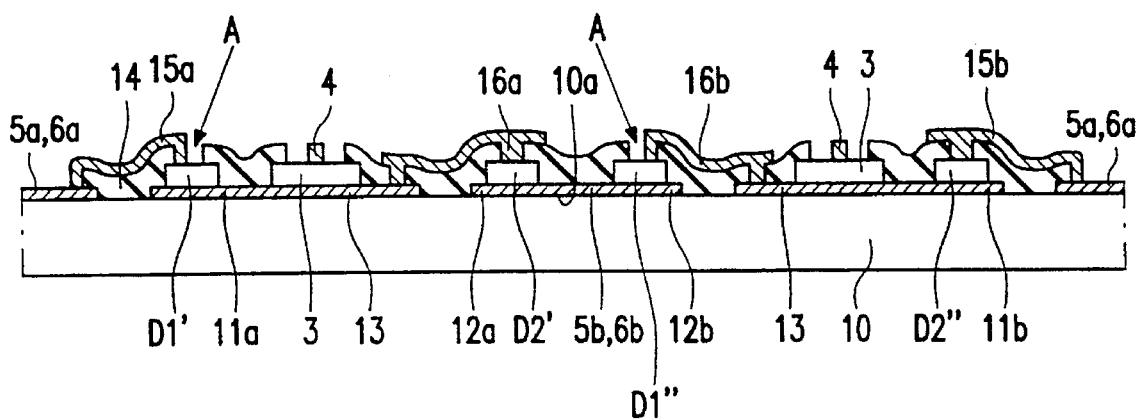

FIG. 8 shows one pixel of each of the adjacent rows N and N+1 and illustrates one possible schematic layout for one example of the image sensor shown in FIG. 7 while FIG. 9 illustrates a cross-sectional view taken along the line IX—IX in FIG. 8 of a pixel 2a in the Nth one of the rows and FIG. 10 illustrates a cross-sectional view taken along the line X—X of the two pixels 2a of the N and N+1 rows in the same column.

In this example, a first electrically conductive layer, again generally a chromium layer, is defined on an insulative, generally transparent, substrate 10, which may be formed of a suitable glass or plastics material, to form at least part of the row conductors 5, 6, the cathode electrodes 11a and 11b of the first switching diodes D1' and second switching diodes D2", the cathode electrodes 12a and 12b of the second switching diodes D2' and first switching diodes D1' and the cathode electrodes 13 of the photosensitive diodes 3. As shown in FIGS. 8 to 10, the cathode electrodes 11a and 11b are formed integrally with the cathode electrode 13 of the associated photosensitive diode 3 while the cathode electrodes 12a and 12b are formed integrally with at least part of the associated row conductor 5b, 6b.

In this example, the diodes 3, D1 and D2 are formed as amorphous silicon n-i-p diodes by depositing in sequence n conductivity, intrinsic conductivity and p conductivity amorphous silicon layers. These layers are then patterned to define the diode structures as shown in FIGS. 9 and 10. In the interests of simplicity, the diode structures are not shown crosshatched in FIGS. 9 and 10.

An insulating layer, generally a silicon nitride layer, is then deposited and patterned to define dielectric isolation regions 14. A second electrically conductive layer, again generally a chromium layer, is then deposited and patterned to define first interconnects 15a and 15b respectively coupling the anode of each first switching diode D1' and each second switching diode D2" to the associated row conductor 5a, 6a, second interconnects 16a and 16b respectively coupling the cathode of each first switching diode D1' to the anode of the associated second switching diode D2' and the cathode of each second switching diode D2" to the anode of the associated first switching diode D1" at least part of the column conductors 4.

As is clearly shown in the example of FIG. 8, the layout structure of the pixels 2a of the remaining rows N−1, N+1, N+3, . . . of the image sensor is effectively a mirror image of the pixels 2a of the rows N−2, N, N+2 . . . except with respect to the interconnects, 15a and 16b which are defined to provide given areas A of the diodes D1' and D1" which are exposed to light.

The layout of the image sensor may have any appropriate pattern but, as shown in FIG. 8, the row and column conductors 4 and 5, 6 define a rectangular, generally square grid with the switching diodes D1 and D2 and the photosensitive diodes 3 taking up as little area as possible of the pixels 2a to allow the image sensor to be as transparent as possible enabling the image sensor to be placed on top of something else such as a display without significantly obscuring the display. Of course, where maximum sensitivity is required (for example for X-ray diagnostics equipment), then the areas of the photosensitive diodes 3 should be as large as possible.

The above described structure enables all of the diodes D1, D2 and 3 to be formed as n-i-p rather than p-i-n diodes so enabling all of the diodes to be formed simultaneously. However, if desired, appropriate ones of the diodes may be formed as p-i-n diodes which should simply simplify the interconnection and metallisation patterns. In practice, the most suitable form of diode structure for the particular application will be used, it being borne in mind that generally n-i-p diodes are better photosensitive diodes than p-i-n diodes while p-i-n diodes are better switching diodes than n-i-p diodes.

The switching diodes D2 differ from the photosensitive diodes 3 and photosensitive switching diodes D1 in that the anode and cathode electrodes of the switching diodes D2 shield the diodes from any incident light whereas the photosensitive diodes 3 and photosensitive switching diodes D1 are, as shown in FIGS. 9 and 10, exposed to light.

The image sensor 1a may be manufactured in a similar manner so as to have a pixel layout similar to that of the pixel from row N shown in FIG. 8 but with the diode D2 omitted, of course. The image sensor 1b may also have a similar layout to the pixel from row N shown in FIG. 8 but of course each row of pixels would in that case have its own separate two row conductors.

Figure 11:
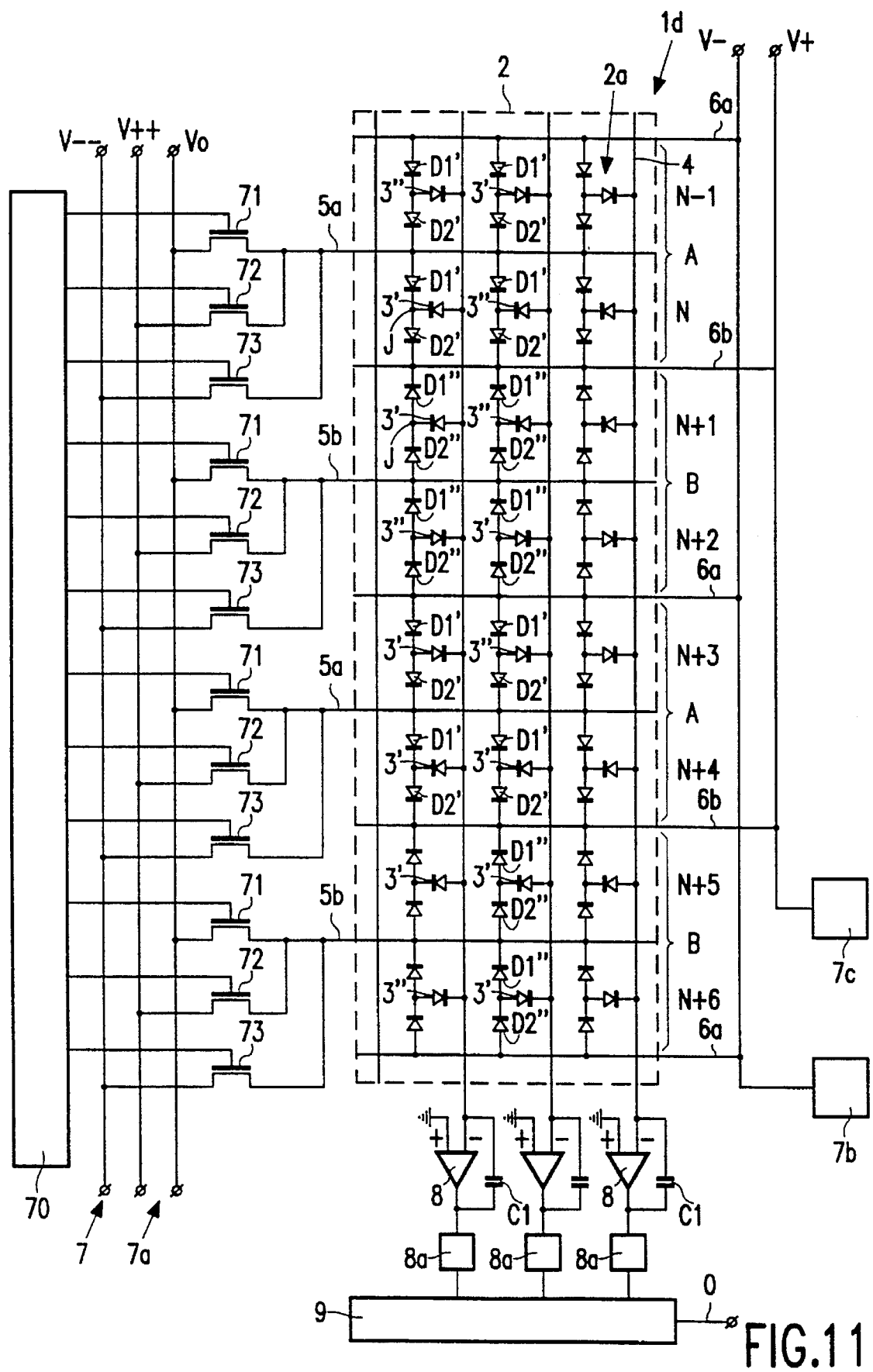
FIG. 11 is a schematic circuit layout for a fourth example of an imaging device in accordance with the invention.

FIG. 11 illustrates another example of an imaging device 1d. The imaging device 1d is similar to that shown in the example of FIGS. 7 to 10 except that, in this case, one of the two conductors associated with each row forms a row conductor 5a, 5b and the other 6a, 6b is provided by one of first and second reference conductors so that adjacent row conductors 5a, 5b are separated by a reference conductor 6a or 6b and each first reference conductor 6a is separated from any other first reference conductor 6a by two row conductors 5a, 5b and a second reference conductor 6b. The first and second rectifying elements D1' an D2' of storage elements 3 associated with a respective row conductor 5a, 5b are oppositely oriented to the first and second rectifying elements D1" and D2" of storage elements 3 associated with any adjacent row conductors 5b, 5a.

Thus, in the example shown in FIG. 11, the switching diodes D1' and D2' in each alternate pair A of rows N−1 and N, N+3 and N+4 . . . are oriented so that the anodes of the first switching diodes D1' in the first row N−1, N+3 . . . of the pair A are coupled to the first reference or common conductor 6a while the cathodes of the switching diodes D2' of that first row N−1, N+3 . . . are coupled to the associated first row conductor 5a and to the anodes of the first switching diodes D1' in the second row N, N+4 . . . of that pair A with the cathodes of the switching diodes D2' of the second row N, N+4 . . . of that pair A being coupled to the second reference or common conductor 6b.

The switching diodes D1" and D2" in the pair B of rows N+1 and N+2 adjacent the pair of rows N−1 and N (and N+5 and N+6 adjacent rows N+3 and N+4 and so on) are oriented so that the cathodes of the first switching diodes D1" in the first row N+1, N+5 . . . of the pair B are coupled to the second reference conductor 6b while the anodes of the switching diodes D2" of that first row N+1, N+5 . . . of that pair B are coupled to the associated second row conductor 5b and to the cathodes of the first switching diodes D1" in the second row N+2, N+6 . . . of that pair B with the anodes of the switching diodes D2" of the second row N+2, N+6 . . . of that pair B being coupled to the first reference conductor 6a.

The photosensitive diodes 3 of the two rows in each pair of rows A or B are oppositely oriented to one another so that the photosensitive diodes 3' of the two rows (one from a pair of rows A and one from a pair of rows B) coupled to the same reference conductor 6a or 6b are oriented in the same direction.

Thus, the photosensitive diodes 3' of rows N, N+1, N+4, N+5 . . . are oriented so that the cathodes of the photosensitive diodes 3' are coupled to the junction or node J between the cathode of the associated first switching diode D1 and the anode of the associated second switching diode D2 while the anodes of the photosensitive diodes 3' are coupled to the associated column conductor 4.

The photosensitive diodes 3" in the remaining rows N−1, N+2, N+3, N+6 . . . are oriented so that the anodes of the photosensitive diodes 3" are coupled to the junction or node J between the anode of the associated first switching diode D1 and the cathode of the associated second switching diode D2 while the cathodes of the photosensitive diodes 3" are coupled to the associated column conductor 4.

In the example illustrated in FIG. 11, the means for supplying voltages comprises a row driving circuit arrangement 7a for supplying the appropriate voltages to the row conductors 5a and 5b and first and second reference voltage sources 7b and 7c for supplying the first and second reference voltages V− and V+, respectively.

Each of the row conductors 5a, 5b is coupled to voltage supply lines V++, $V_0$ and V— via respective switching transistors 71, 72 and 73. The gate or control electrodes of the switching transistors 71, 72 and 73 are coupled to a shift register and decoder circuit 70. The shift register and decoder circuit 70 is arranged to activate the appropriate transistors 71, 72 and 73 under the control of clock signals in known manner to allow the appropriate voltage signals to be applied to the row conductors 5a and 5b at the appropriate times.

In this example, each charge sensitive amplifier 8 is, for reasons which will be explained below, coupled to the output shift register and decoder circuit 9 by way of a full way rectifier 8a. The full wave rectifiers 8a may be of any suitable known form and are known simply as blocks in FIG. 11.

Figure 12:
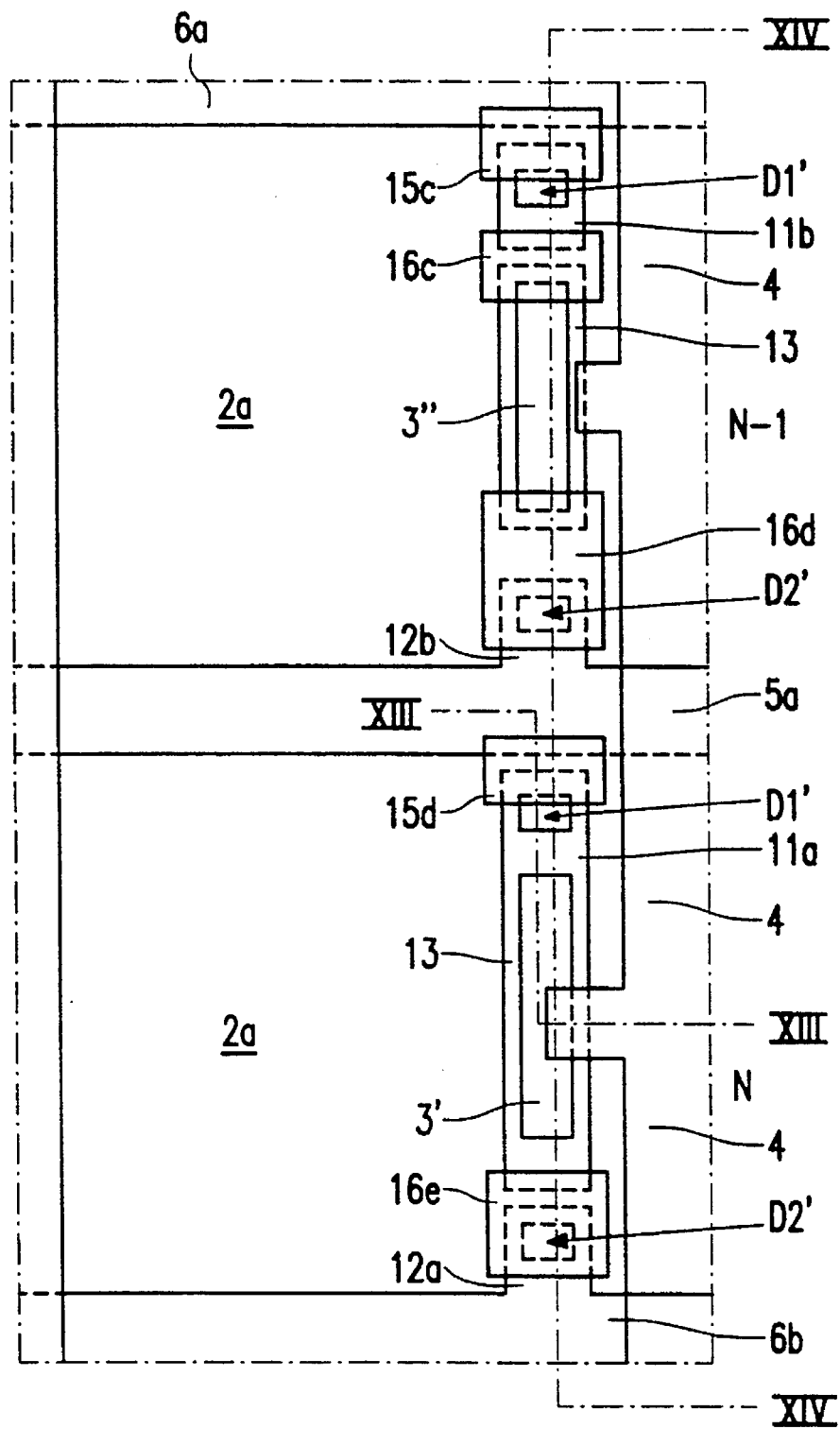
FIG. 12 shows a plan view of part of the imaging device shown in FIG. 11.
Figure 14:
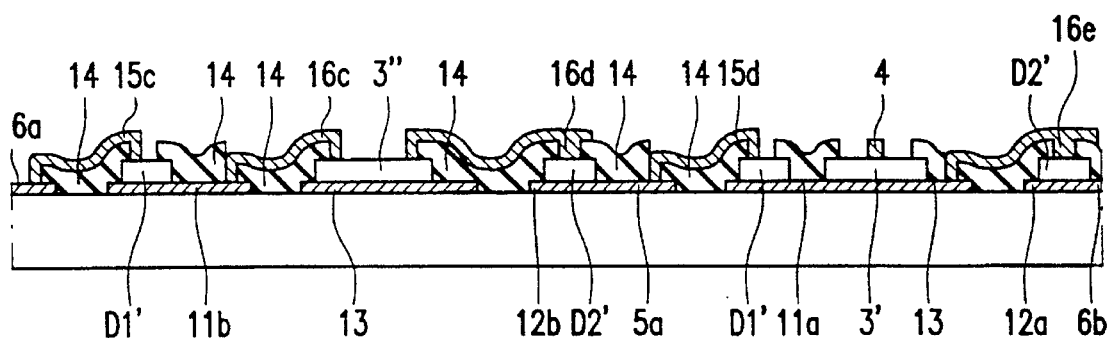
FIG. 14 is a cross-sectional view taken along the line XIV—XIV in FIG. 12.

FIG. 12 shows one pixel of each of the N–1 and N rows of one possible schematic layout for one example of the image sensor shown in FIG. 11 while FIG. 5 illustrates a cross-sectional view taken along the line XIII—XIII in FIG. 12 of a pixel 2a in the Nth one of the rows and FIG. 14 illustrates a cross-sectional view taken along the line XIV—XIV of the two pixels 2a of the N–1 and N rows in the same column.

Figure 13:
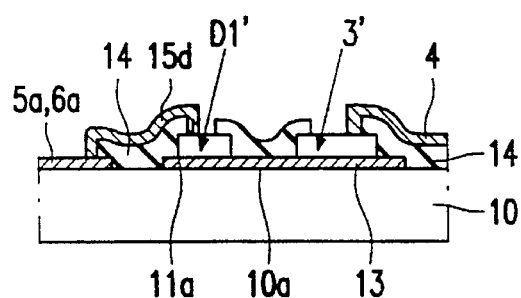
FIG. 13 is a cross-sectional view taken along the lines XIII—XIII in FIG. 12.

In this example, the first electrically conductive layer, again generally a chromium layer, defined to form at least part of the row conductors 5a and 5b and the reference conductors 6a and 6b, the cathode electrodes 11a and 11b of the first switching diodes D1' of the N and N–1 rows, the cathode electrodes 12a and 12b of the second switching diodes D2' of the N and N–1 rows and the cathode electrodes 13 of the photosensitive diodes 3' and 3". As shown in FIGS. 12 to 14, the cathode electrode 11a of the first switching diode D1' of the row N is formed integrally with the cathode electrode 13 of the associated photosensitive diode 3' while the cathode electrodes 12a and 12b are formed integrally with at least part of the associated reference conductor 6b and row conductor 5a.

The second electrically conductive layer, again generally a chromium layer, is then deposited and patterned to define first interconnects 15c and 15d respectively coupling the anode of the first switching diode D1' of the row N–1 to the associated reference conductor 6a and the anode of the first switching diode D1' of the row N to the associated row conductor 5a, a second interconnect 16c coupling the cathode of the photosensitive switching diode D1' of the row N–1 to the anode of the photosensitive diode 3" and second interconnects 16d and 16e respectively coupling the anode of the photosensitive diode 3" to the anode of the second switching diode D2' of the row N–1 and the anode of the second switching diode D2' of the row N to the cathode of the photosensitive diode 3', and at least part of the column conductors 4.

The pixels 2a of the adjacent row N+1 of the image sensor have a similar structure to those of the row N but the actual orientation is reversed so that the pixels 2a of the row N+1 are a mirror image of the pixels 2a of the row N. Similarly, the pixels 2a of the row N–2 of the image sensor have a similar structure to those of the row N–1 but the actual orientation is reversed so that the pixels 2a of the row N–2 are a mirror image of the pixels 2a of the row N–1, and so on. Thus, the pixels in adjacent rows but in different pairs A and B are effectively a mirror image of one another with the mirror being parallel to the reference conductor 6a or 6b separating the rows.

The operation of the image sensor 1d will now be described.

In operation of the image sensor 1d, the first common conductor 6a is held at a potential of V– while the second common conductor 6b is held at a potential of V+. In order to read out charge previously stored at a pixel in row N–1, the row driving circuit 70 renders conducting the transistor 73 coupled to the row conductor 5a of the pixel row N–1 and the transistors 71 coupled to the remaining row conductors 5a, 5b of the image sensor. Thus, the row conductor 5a of the pixel row N–1 is coupled to the voltage supply line V— while the remaining row conductors 5a, 5b are coupled to the voltage supply line $V_0$. The switching diodes D1' and D2' of the pixels 2a in the pixel row N–1 are thus forward-biased while the switching diodes D1 and D2 of the pixels 2a of the pixel rows except the row N–1 are reverse-biased.

In order to read out charge previously stored at a pixel in row N, the row driving circuit 70 renders conducting the transistor 72 coupled to the row conductor 5a of the pixel row N and the transistors 71 coupled to the remaining row conductors 5a, 5b of the image sensor. Thus, the row conductor 5a of the pixel row N is coupled to the voltage supply line V++ while the remaining row conductors 5a, 5b are coupled to the voltage supply line $V_0$. The switching diodes D1" and D2" of the pixels 2a in the pixel row N are thus forward-biased while the switching diodes D1 and D2 of the pixels 2a of the pixel rows except the row N are reverse-biased.

In order to read out charge previously stored at a pixel in row N+1, the row driving circuit 70 renders conducting the transistor 72 coupled to the row conductor 5b of the pixel row N+1 and the transistors 71 coupled to the remaining row conductors 5a, 5b of the image sensor. Thus, the row conductor 5b of the pixel row N+1 is coupled to the voltage supply line V++ while the remaining row conductors 5a, 5b are coupled to the voltage supply line $V_0$. The switching diodes D1" and D2" of the pixels 2a in the pixel row N+1 are thus forward-biased while the switching diodes D1 and D2 of the pixels 2a of the pixel rows except the row N+1 are reverse-biased.

To read out charge previously stored at a pixel in row N+2, the row driving circuit 70 renders conducting the transistor 73 coupled to the row conductor 5b of the pixel row N+2 and the transistors 71 coupled to the remaining row conductors 5a, 5b of the image sensor. Thus, the row conductor 5b of the pixel row N+2 is coupled to the voltage supply line V— while the remaining row conductors 5a, 5b are coupled to the voltage supply line $V_0$. The switching diodes D1' and D2' of the pixels 2a in the pixel row N+2 are thus forward-biased while the switching diodes D1 and D2 of the pixels 2a of the pixel rows except the row N+2 are reverse-biased.

As will be appreciated by those skilled in the art, the charge stored at every fourth (for example the Nth, N+4th, N+8th etc.) row of pixels is readout in the same way, although, of course, generally the rows-will be read in sequence.

In each case, when charge stored at a selected row of pixels is read out by causing the associated first and second switching elements D1 and D2 to become forward-biased, current will flow through the photosensitive diode capacitances C of the pixels of the selected pixel row to the associated charge sensitive amplifiers 8 and subsequently, via the associated full wave rectifier 8a, to the output shift register and decoder circuit 9 which supplies an output O to an appropriate store or to a display, neither of which is shown. The full wave rectifiers 8a are required because, as will have been appreciated from the description above, the photosensitive diodes 3' in rows N–1, N+2, N+3, N+6, N+7

... have their cathodes coupled to the associated column conductor 4 while the photosensitive diodes 3" in rows N, N+1, N+4, N+5, . . . ave their anodes coupled to the associated column conductor 4 so that current will flow in opposite directions through the photosensitive diodes 3' and the photosensitive diodes 3" thus causing the voltage signals produced by the charge sensitive amplifiers 8 to be of opposite polarity for the pixels having photosensitive diodes 3' from the voltage signals produced by the charge sensitive amplifiers 8 for the pixels having the photosensitive diodes 3".

In each case, current flows through the diode capacitances C of the pixels of the selected pixel row until the average of the voltages of the associated row and reference conductors is reached.

Thus, in each of the examples described with reference to FIGS. 5 to 14, the photosensitive diode capacitances C can be completely recharged within the corresponding readout pulse and there is accordingly no lag. This means that if the noise associated with the image sensor is low, the image sensor can operate in low-light Conditions without excessive lag problems. Also, it should be possible to read the pixels more quickly because the switching diodes D1 and D2 of the selected pixel row are strongly forward biased and are able to recharge the pixel capacitances quickly. In addition, for a given frame time (that is the time to read out the entire image sensor), the image sensor should exhibit very little vertical cross-talk, that is interference between column conductors, because such cross-talk is a function of the time for which a pixel row is selected and the frame time and in the present case, the row select time can be reduced. In addition, in the examples of FIGS. 7 to 14 the fact that the number of row conductors is half that of a conventional image sensor such as that shown in FIG. 1 and a quarter that of the device shown in FIG. 5 means that an image sensor in accordance with the present invention is particularly suitable for mounting on a common substrate with other similar image sensors in the manner described in EP-A-555907 (which corresponds to U.S. Pat. No. 5,315,101) because of the resulting larger separation of the row conductors.

In each of the examples described, each row of pixels may thus be read in sequence by applying the appropriate voltages to the appropriate row conductors 5a and 5b. When the pixels of a particular row are being read out, the remaining pixels have their associated switching diodes D1 and D2 reverse-biased and accordingly these pixels are in their integration period in which charge resulting from the photogeneration of charge carders within the photosensitive diode by any light incident on the pixel is stored at the pixel. Thus, the charge stored at a row of pixels during the integration period is read out in the subsequent read out period and the rows of pixels are read out sequentially.

Figure 15:
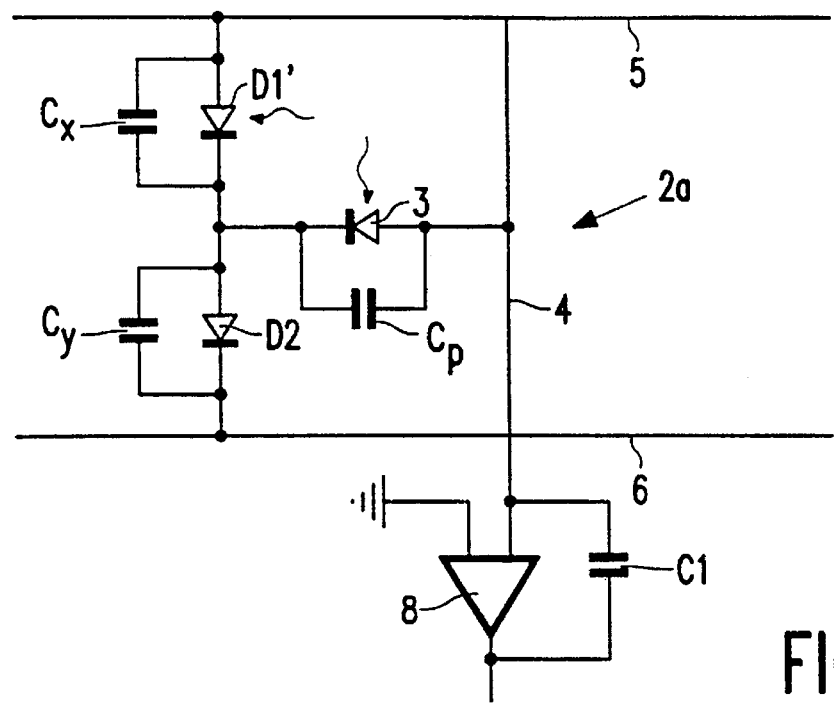
FIG. 15 illustrates a circuit diagram of a pixel of an imaging device as shown in any one of FIGS. 5, 7 and 11.
Figure 16:
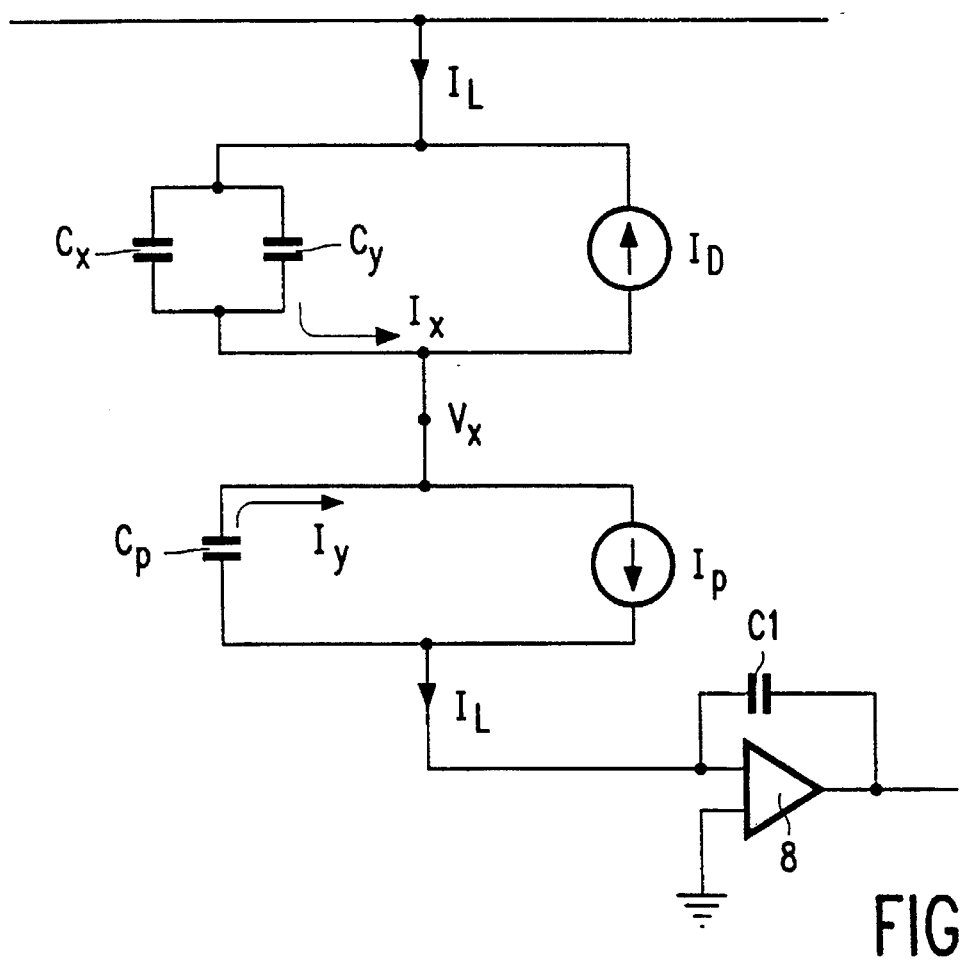
FIG. 16 illustrates an equivalent circuit diagram for the pixel shown in FIG. 15.

The image sensors 1b, 1c and 1d avoid or at least reduce the possibility of vertical cross-talk in a manner similar to the image sensor 1a as will now be described with reference to FIGS. 15 and 16. FIG. 15 shows one pixel 20 of an image sensor 1b, 1c or 1d where FIG. 16 is an equivalent circuit diagram for a pixel of row N in any of FIGS. 5, 7 and 11. In FIG. 16, the photosensitive switching diode D1 is represented as a source of current $I_D$ in parallel with the capacitance $C_x$ while the photosensitive diode 3 is represented as a current of current $I_p$ in parallel with the capacitance $C_p$. The non-photosensitive switching diode D2 is represented simply as the capacitance $C_y$ in parallel with the capacitance $C_x$ because it of course is not responsive to incident light.

Consider the situation where the pixel 2a is unselected but is sensing light while another selected pixel is being read out. From FIG. 16 and using Kirchhoff's Law, then the leakage current $I_L$ flowing down the column conductor 4 from the unselected pixel 2a is:

$$I_P - I_L = I_Y \tag{9}$$

where $I_Y$ is the current flowing through the capacitance $C_p$, and $$I_L + I_D = I_X \tag{10}$$

where $I_x$ is the current flowing through the capacitance $C_x$ also $$I_X = -(C_X + C_Y)\frac{dV_X}{dt} \ , I_Y = -C_P \frac{dV_X}{dt} \tag{11}$$

From equations 9, 10 and 11 an expression can be obtained for $I_L$, as follows $$I_L = \frac{(C_X + C_Y)I_P - C_P I_D}{C_P + (C_X + C_Y)} \tag{12}$$

From equation 12, the condition for zero leakage current $I_L$ is:

$$(C_X + C_Y)I_P = C_P I_D \tag{13}$$

Thus if $$\frac{I_P}{C_P} = \frac{I_D}{(C_X + C_Y)} \tag{14}$$

then $I_L$ equals zero and the vertical crosstalk is eliminated.

The photosensitive current $I_{PHOTO}$ is equal to $KA_{CON}$ where K is a constant and $A_{CON}$ is the area of the photodiode which is exposed to light (normally this area is the area of the hole in the opaque electrode or contact of the photodiode, for example the electrode 4 in FIG. 9). Accordingly the condition for no leakage current can again be defined by the geometry of the photosensitive diodes D1 and 3'. If it is assumed that the switching diodes D1 and D2 are of equal area and the thickness of all three diodes D1, D2 and 3' is the same, then, in terms of this geometry, equation 14 becomes:

$$\left(\frac{A_{CD1}}{2A_{DD1}}\right) = \left(\frac{A_{C3}}{A_{D3}}\right) \tag{15}$$

where $A_{DD1}$ and $A_{D3}$ are the areas of the switching diode D1 and photosensitive diode 3, respectively, and are thus proportional to their capacitance while $A_{CD1}$ and $A_{C3}$ are the areas of the switching diode D1 and photosensitive diode 3, respectively, exposed to incident light and are so proportional to the photocurrent generated by light incident on the respective diode. As used herein the term "area" in relation to the diodes D1, D2 and 3 means the area of the diode in a plane generally parallel to the diode electrodes, that is, in relation to FIGS. 9 and 10, for example, in a plane parallel to the surface of the substrate 10 upon which the diodes are formed. The thicknesses of the diodes are measured in a direction perpendicular to the surface of the substrate 10.

In relation to the image sensor 1d, the same considerations of course also apply to the rows in which the photosensitive diodes 3 have their cathodes coupled to the associated column conductor 4, although, as indicated above, current flows in the opposite direction through those diodes.

Accordingly, by appropriately selecting the relative geometries of the diodes D1, D2 and 3, the leakage current from an unselected pixel in the column of the selected pixel will flow internally within the capacitance/photocurrent loop of that unselected pixel and not through the column conductor 4, so eliminating or at least substantially reducing the vertical cross-talk. Thus, for example, if the areas of the contact holes of the two photosensitive diodes $A_{CD1}$ and $_{AC3}$ are equal, then, for zero vertical cross-talk, the area of the photodiode 3 should be twice that of the photosensitive switching diode D1.

As will be appreciated by those skilled in the art, other drive schemes may be possible and a single row driver may be used if a suitable source capable of providing four different voltage levels is available.

The row, common and column conductors need not necessarily extend horizontally and vertically as shown in the drawings. Indeed, the row and common conductors may extend vertically while the column conductors extend horizontally, that is the device as shown may be rotated through 90°. Also, the row, common and column conductors need not necessarily be perpendicular to one another, any suitable arrangement may be used.

It should, of course, be understood that the orientations of the diodes may be reversed, although this will of course require appropriate changes in the voltages required to drive the device.

It should be understood that, as used herein, the term "rectifying element" means any element which has an asymmetric characteristic and passes as low a current as possible in one direction (the reverse direction) and the required current in the other direction (the forward direction).

The rectifying elements need not necessarily be diodes but could be any suitable form of, generally two-terminal, rectifying element. Similarly, the photosensitive elements need not necessarily be diodes but could be other types of photosensitive device which pass current when illuminated. Thus, for example, the photosensitive diodes could be replaced by photoconductors, for example formed of lead oxide, each in series with an appropriate capacitance.

From reading the present disclosure, other modifications and variations will be apparent to persons skilled in the art. Such modifications and variations may involve other features which are already known in the art and which may be used instead of or in addition to features already described herein.

The invention claimed is:

1. An imaging device comprising an array of imaging elements each comprising a photosensitive element for sensing light incident on the imaging element and for storing charge representing the incident light and a rectifying element, the imaging elements being arranged in rows and columns with each photosensitive element and the associated rectifying element being coupled in series between an associated first conductor and an associated second conductor for allowing charge stored at a selected imaging element to be read out by stored charge reading means by applying voltages to the second conductors to forward bias the rectifying element of the selected imaging element to cause a current representing the charge stored at the photosensitive element of the selected imaging element to flow though the associated first conductor, wherein each rectifying element comprises a photosensitive rectifying element for also receiving light incident on the imaging element and the relative dimensions of each photosensitive element and the associated rectifying element are such that when an imaging element is receiving light but is not selected any leakage current flows internally within the imaging element and makes substantially no contribution to current flowing through the associated first conductor.

2. An imaging device according to claim 1, wherein the photosensitive and photosensitive rectifying elements comprise junction diodes and the relative dimensions of each photosensitive element and the associated photosensitive rectifying element are such that:

$$C_D I_P = C_P I_D$$

where $C_D$ and $C_P$ are the intrinsic capacitances of the photosensitive rectifying and the photosensitive element, respectively, and $I_P$ and $I_D$ are the currents generated by light incident on the photosensitive element and the photosensitive rectifying element, respectively.

3. An imaging device according to claim 2 wherein for each imaging element, the photosensitive rectifying element has a given area and the photosensitive element and the photosensitive rectifying element have a second given area which is exposed to incident light with the respective areas of the photosensitive rectifying and photosensitive elements being such that:

$$\left(\frac{A_{CD1}}{A_{DD1}}\right) = \left(\frac{A_{C3}}{A_{D3}}\right)$$

where $A_{D3}$ and $A_{DD1}$ are the areas of a photosensitive element and the associated photosensitive rectifying element, respectively, while $A_{C3}$ and $A_{CD1}$ are the second given areas of a photosensitive element and the associated photosensitive rectifying element, respectively, which are exposed to incident light.

4. An imaging device according to claim 1, wherein each imaging element is associated with a third conductor with each photosensitive rectifying element being coupled in series with a further rectifying element between the associated second and third conductors and with the photosensitive element of the imaging element being coupled between the associated first conductor and a junction between the associated photosensitive rectifying and further rectifying elements, and wherein the photosensitive rectifying elements and photosensitive elements are arranged so that, for each imaging element $$(C_x + C_y)I_P = C_P I_D$$

where $C_x$, $C_y$ and $C_P$ are the intrinsic capacitances of the photosensitive rectifying element, the further rectifying element and the photosensitive element, respectively, and $I_P$ and $I_D$ are the currents generated by light incident on the photosensitive element and the photosensitive rectifying element, thereby reducing leakage current from a photosensitive element during the reading out of charge from another photosensitive element in the same column of storage elements.

5. An imaging device according to claim 4, wherein, for each imaging element, the associated photosensitive and further rectifying elements each have a given area and the photosensitive element and the photosensitive rectifying element have a second given area which is exposed to incident light with the respective areas of the photosensitive rectifying and photosensitive elements being such that:

$$\left(\frac{A_{CD1}}{2A_{DD1}}\right) = \left(\frac{A_{C3}}{A_{D3}}\right)$$

where $A_{D3}$ and $A_{DD1}$ are the areas of a photosensitive element and the associated photosensitive rectifying elements, respectively, while $A_{C3}$ and $A_{CD1}$ are the second given areas of a photosensitive element and the associated photosensitive rectifying element, respectively, which are exposed to incident light.

6. An imaging device according to claim 4, wherein, for each imaging element, the associated photosensitive and further rectifying elements each have a given area and the photosensitive element and the photosensitive rectifying element have a second given area which is exposed to incident light with the respective areas of the photosensitive rectifying and photosensitive elements being such that:

$$\left(\frac{A_{CD1}}{2A_{DD1}}\right) = \left(\frac{A_{C3}}{A_{D3}}\right)$$

where $A_{D3}$ and $A_{DD1}$ are the areas of a photosensitive element and the associated photosensitive rectifying elements, respectively, while $A_{C3}$ and $A_{CD1}$ are the second given areas of a photosensitive element and the associated photosensitive rectifying element, respectively, which are exposed to incident light.

* * * * *